(12) United States Patent
Kobayashi et al.

(10) Patent No.: US 11,534,837 B1
(45) Date of Patent: Dec. 27, 2022

(54) CUTTING TOOL (71) Applicants: Sumitomo Electric Hardmetal Corp., Itami (JP); Sumitomo Electric Industries, Ltd., Osaka (JP)

(72) Inventors: Fumiyoshi Kobayashi, Itami (JP); Anongsack Paseuth, Itami (JP); Yasuki Kido, Itami (JP); Kosuke Tominaga, Osaka (JP)

(73) Assignees: SUMITOMO ELECTRIC HARDMETAL CORP., Itami (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/633,216

(22) PCT Filed: Jun. 14, 2021

(86) PCT No.: PCT/JP2021/022458
§ 371 (c)(1),
(2) Date: Feb. 7, 2022

(51) Int. Cl.
*B23B 27/14* (2006.01)
*C23C 16/36* (2006.01)

(52) U.S. Cl.
CPC ............ *B23B 27/148* (2013.01); *C23C 16/36* (2013.01); *B23B 2228/105* (2013.01)

(58) Field of Classification Search
CPC ............ B23B 27/148; B23B 2228/105; B23B 2224/24; C23C 16/36
See application file for complete search history.

(56) References Cited

U.S. PATENT DOCUMENTS

| | | | |
|---|---|---|---|
| 2016/0001374 A1 | 1/2016 | Zhu | |
| 2016/0333473 A1 | 11/2016 | Stiens et al. | |
| 2018/0178294 A1 | 6/2018 | Paseuth et al. | |
| 2019/0358711 A1* | 11/2019 | Ishigaki | C23C 30/005 |

(Continued)

FOREIGN PATENT DOCUMENTS

| | | |
|---|---|---|
| JP | 2002-263913 A | 9/2002 |
| JP | 2013-223894 A | 10/2013 |
| JP | 2014-121748 A | 7/2014 |

(Continued)

OTHER PUBLICATIONS

English translation of JP 2019171488 (Year: 2019).*

(Continued)

*Primary Examiner* — Alan Snyder
(74) *Attorney, Agent, or Firm* — Xsensus LLP (57) ABSTRACT

A cutting tool includes a substrate and a coated film arranged on the substrate. The coated film includes a first layer. The first layer includes a plurality of crystal grains. The crystal grains are composed of $Al_xTi_{1-x}C_yN_{1-y}$, wherein x is more than 0.65 and less than 0.95, and y is not less than 0 and less than 0.1. In a first region, the crystal grains have an average aspect ratio of not more than 3.0. In a second region, the crystal grains have an average aspect ratio of more than 3.0 and not more than 10.0. The crystal grains include crystal grains having a cubic crystal structure. The first layer has a ratio of an area occupied by the crystal grains having a cubic crystal structure of not less than 90%. The first layer has a thickness of not less than 2 μm and not more than 20 μm.

3 Claims, 5 Drawing Sheets (56) References Cited

U.S. PATENT DOCUMENTS

2021/0402486 A1   12/2021   Ishigaki et al.

FOREIGN PATENT DOCUMENTS

| JP | 2016-30319 A | | 3/2016 |
|---|---|---|---|
| JP | 2017-508632 A | | 3/2017 |
| JP | 2019171488 A | * | 10/2019 |
| JP | 2020-55097 A | | 4/2020 |
| WO | 2014/129530 A1 | | 8/2014 |
| WO | 2017/175400 A1 | | 10/2017 |

OTHER PUBLICATIONS

International Search Report and Written Opinion dated Aug. 3, 2021, received for PCT Application PCT/JP2021/022458, Filed on Jun. 14, 2021, 14 pages including English Translation.

* cited by examiner

CUTTING TOOL

CROSS-REFERENCE TO RELATED APPLICATION

The present application is based on PCT filing PCT/JP2021/022458, filed Jun. 14, 2021, the entire contents of which are incorporated herein by reference.

TECHNICAL FIELD

The present disclosure relates to a cutting tool.

BACKGROUND ART

Conventionally, a cutting tool including a substrate and a coated film formed thereon has been used for cutting steel, castings, and the like (Japanese Patent Laying-Open No. 2016-30319 (Patent Literature 1)). Patent Literature 1 discloses a cutting tool including a coating layer having a predetermined layer thickness, the coating layer including an AlTiCN layer, and the AlTiCN layer has a columnar structure in the film thickness direction. It is expected that the wear resistance of the cutting tool will be improved by having such a structure.

CITATION LIST

PATENT LITERATURE

PTL 1: Japanese Patent Laying-Open No. 2016-30319

SUMMARY OF INVENTION

A cutting tool of the present disclosure comprises:
a substrate; and
a coated film arranged on the substrate, wherein
the coated film includes a first layer,
the first layer includes a plurality of crystal grains, and
the crystal grains are composed of $Al_xTi_{1-x}C_yN_{1-y}$,
where x is more than 0.65 and less than 0.95, and
y is not less than 0 and less than 0.1, wherein
in a first region, the crystal grains have an average aspect ratio of not more than 3.0, where the first region is a region that is sandwiched between a surface S1 of the first layer or an interface S2 on a surface side of the first layer and a first virtual plane VS1, and
in a second region, the crystal grains have an average aspect ratio of more than 3.0 and not more than 10.0, where the second region is a region that is sandwiched between the first virtual plane VS1 and an interface S3 on a substrate side of the first layer,
where the first virtual plane VS1 passes through a point that is 1 μm away from the surface S1 or the interface S2 on the substrate side, and is parallel to the surface S1 or the interface S2, wherein
the crystal grains include crystal grains having a cubic crystal structure,
the first layer has a ratio of an area occupied by the crystal grains having a cubic crystal structure of not less than 90%,
the average aspect ratios and the area ratio are measured on a cross section along a normal to an interface between the substrate and the coated film, and
the first layer has a thickness of not less than 2 μm and not more than 20 μm.

DETAILED DESCRIPTION

[Problem to be Solved by the Present Disclosure]

Conventionally, when processing gray cast iron, the cutting may be performed under wet conditions using a cutting oil as a dust countermeasure of chips expelled by the processing. When wet processing of gray cast iron is performed using a cutting tool having an AlTiCN layer, there is little wear on the rake face; however, since thermal cracking on the rake face and wear at the flank face tend to occur, the tool life of the cutting tool tends to be shortened. Therefore, there is a demand for a cutting tool having a long tool life even in wet processing of gray cast iron.

[Advantageous Effect of the Present Disclosure]

According to the present disclosure, a cutting tool can be provided that has a long tool life even in wet processing of gray cast iron in particular.

[Description of Embodiments]

Firstly embodiments of the present disclosure, will be listed and described.

(1) A cutting tool of the present disclosure comprises:
a substrate; and
a coated film arranged on the substrate, wherein
the coated film includes a first layer,
the first layer includes a plurality of crystal grains, and
the crystal grains are composed of $Al_xTi_{1-x}C_yN_{1-y}$,
where x is more than 0.65 and less than 0.95, and
y is not less than 0 and less than 0.1, wherein
in a first region, the crystal grains have an average aspect ratio of not more than 3.0, where the first region is a region that is sandwiched between a surface S1 of the first layer or an interface S2 on a surface side of the first layer and a first virtual plane VS1, and
in a second region, the crystal grains have an average aspect ratio of more than 3.0 and not more than 10.0, where the second region is a region that is sandwiched between the first virtual plane VS1 and an interface S3 on a substrate side of the first layer,
where the first virtual plane VS1 passes through a point that is 1μm away from the surface S1 or the interface S2 on the substrate side, and is parallel to the surface S1 or the interface S2, wherein
the crystal grains include crystal grains having a cubic crystal structure,
the first layer has a ratio of an area occupied by the crystal grains having a cubic crystal structure of not less than 90%, the average aspect ratios and the area ratio are measured on a cross section along a normal to an interface between the substrate and the coated film, and the first layer has a thickness of not less than 2 μm and not more than 20 μm.

The cutting tool of the present disclosure can have a long tool life even in wet processing of gray cast iron.

(2) It is preferable that the first layer have a compressive residual stress of not less than 1.0 GPa and less than 4.5 GPa. As a result, the thermal cracking resistance of the cutting tool is further improved.

(3) It is preferable that the first layer have a hardness of not less than 30 GPa and not more than 40 GPa. As a result, the wear resistance of the cutting tool is further improved.

[Details of Embodiments of Present Disclosure]

A specific example of the cutting tool of one embodiment of the present disclosure (hereinafter, also referred to as the "present embodiment") will now be described with reference to the drawings. In the drawings of the present disclosure, the same reference signs represent the same or equivalent portion. Dimensional relationships such as length, width, thickness, and depth have been appropriately changed for the sake of clarity and simplification of the drawings, and do not necessarily show the actual dimensional relationship.

Herein, the notation in the form "A to B" means the upper limit and the lower limit of the range (that is, not less than A and not more than B). Only B may be followed by a unit while there is no unit for A, and in such a case, the unit of A and the unit of B are the same.

As used herein, when a compound or the like is represented by a chemical formula, the atomic ratio may not be particularly limited, and in such a case, the ratio shall include all previously known atomic ratios, and is not necessarily limited to those atomic ratios that are within the stoichiometric range. For example, if "AlTiCN" is written, the ratio between the numbers of atoms constituting AlTiCN includes all previously known atomic ratios.

For the crystallographic descriptions herein, the individual faces are shown in ().

[First Aspect: Cutting tool]

Figure 8:
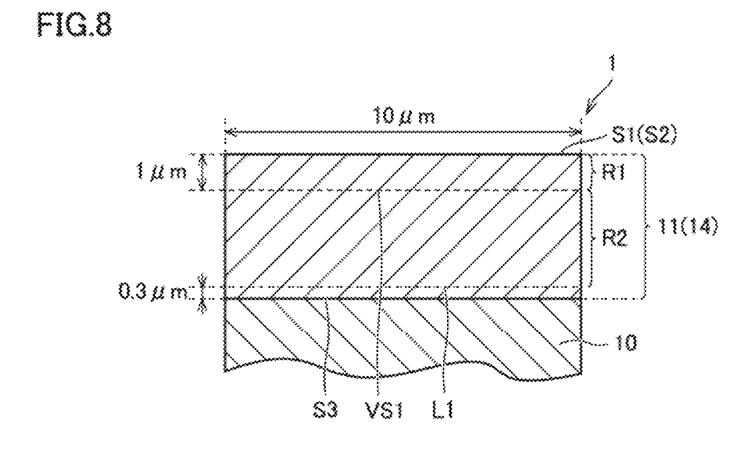
FIG. 8 is a schematic cross-sectional view c n example of the cutting tool of the present disclosure.

As illustrated in FIG. 8. a cutting tool 1 according to the present embodiment comprises:

a substrate 10; and a coated film 14 arranged on the substrate 10, wherein the coated film 14 includes a first layer 11, the first layer 11 includes a plurality of crystal grains, and the crystal grains are composed of $Al_xTi_{1-x}C_yN_{1-y}$ where x is more than 0.65 and less than 0.95, and y is not less than 0 and less than 0.1, wherein in a first region R1, the crystal grains have an average aspect ratio of not more than 3.0, wherein the first region R1 is a region that is sandwiched between a surface S1 of the first layer 11 or an interface S2 on a surface side of the first layer 11 and a first virtual plane VS1, and in a second region R2, the crystal grains have an average aspect ratio of more than 3.0 and not more than 10.0, where the second region R2 is a region that is sandwiched between the first virtual plane VS1 and an interface S3 on a substrate side of the first layer 11, where the first virtual plane VS1 passes through a point that is 1 μm away from the surface S1 or the interface S2 on the substrate side, and is parallel to the surface S1 or the interface S2, wherein the crystal grains include crystal grains having a cubic crystal structure, the first layer 11 has a ratio of an area occupied by the crystal grains having a cubic crystal structure of not less than 90%, the average aspect ratios and the area ratio are measured on a cross section along a normal to an interface between the substrate 10 and the coated film 14, and the first layer 11 has a thickness of not less than 2 μm and not more than 20 μm.

The cutting tool of the present disclosure can have a long tool life even in wet processing of gray cast iron. The reason for this is surmised as described below.

(a) The crystal grains include crystal grains having a cubic crystal structure, and the first layer has an ratio of an area occupied by the crystal grains haying a cubic crystal structure of not less than 90%. Therefore, the first layer has a high hardness, and the cutting tool can have excellent wear resistance. As used herein, "wear resistance" means resistance to wear of the coated film when used for cutting.

(b) As described in (a) above, if the ratio of crystal grains having a cubic crystal structure is not less than 90% of the crystal grain of $Al_xTi_{1-x}C_yN_{1-y}$ such a cutting tool has superior wear resistance. However, such a tool generally tends to be formed with the crystal grains having a columnar structure in the film thickness direction. For this reason, in such a cutting tool, the grain boundary of the crystal grains extends in the film thickness direction. Thus, when the cutting tool is used for wet processing of gray cast iron, the cutting tool is susceptible to the occurrence of cracks in the film thickness direction, and thermal cracks tends to form on the cutting surface.

However, in the cutting tool of the present embodiment, the crystal grains have an average aspect ratio of not more than 3.0 in the first region, where the first region is a region that is sandwiched between surface S1 of the first layer or interface S2 on the surface side of the first layer and the first virtual plane VS1, and this can suppress the grain boundaries of the crystal grains from extending in the film thickness direction in the first layer. Therefore, since it is possible to suppress cracks from developing linearly in the film thickness direction in the first layer, the cutting tool of the present embodiment can have excellent thermal cracking resistance in the rake face even when used for wet processing of gray cast iron. As used herein, "thermal cracking resistance" means resistance to the occurrence of cracks at the cutting edge portion during cutting where the cutting edge portion reaches a high temperature.

(c) In the cutting tool of the present embodiment, the crystal grains have an average aspect ratio of more than 3.0 and not more than 10.0 in the second region, where the second region is a region that is sandwiched between the first virtual plane VS1 and interface S3 on a substrate side of the first layer, and thus the first layer is strong against deformation in the shear direction of the cutting tool because the crystal grains tend to form a columnar structure in the film thickness direction. Therefore, the cutting tool of the present embodiment can have excellent wear resistance on the flank face in addition to the rake face even when used for wet processing of gray cast iron.

In short, the cutting tool according to the present embodiment can have a long tool life by having excellent thermal cracking resistance along with excellent wear resistance.

The cutting tool of the present embodiment can be, for example, a drill, an end mill, a cutting-edge-replaceable cutting tip for a drill, a cutting-edge-replaceable cutting tip for an end mill, a cutting-edge-replaceable cutting tip for milling, a cutting-edge-replaceable cutting tip for turning, a metal saw, a gear cutting tool, a reamers, a tap, or the like.

Figure 1:
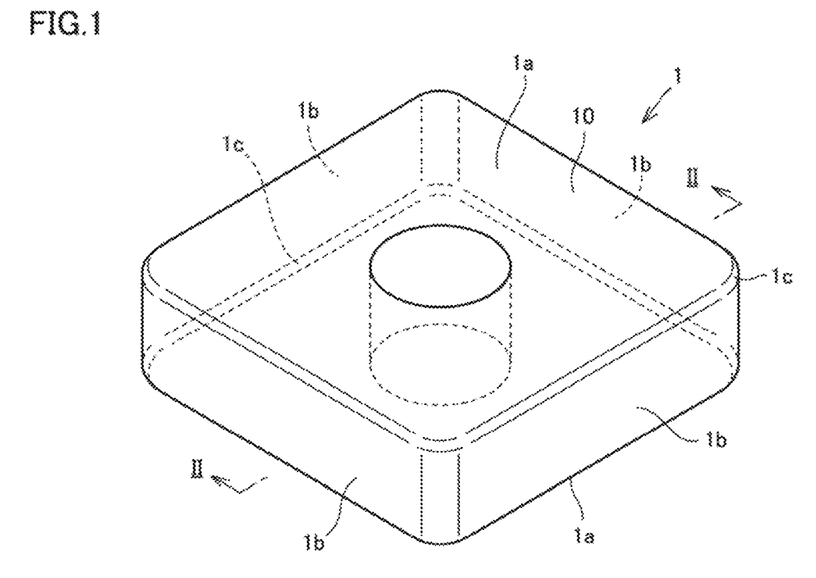
FIG. 1 is a perspective view illustrating an example of a cutting tool of the present disclosure.
Figure 2:
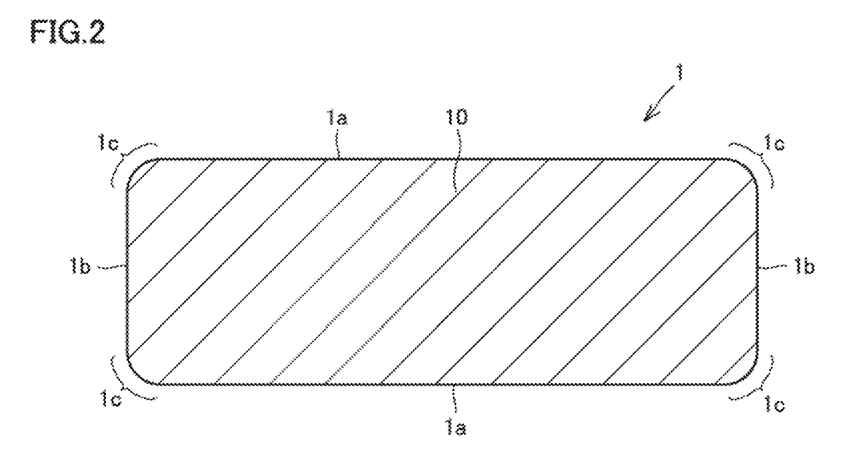
FIG. 2 is a cross-sectional view along the II-II line of FIG. 1.

FIG. 1 is a perspective view illustrating an example of the cutting tool 1 of the present disclosure. FIG. 2 is a cross-sectional view along the II-II line of FIG. 1. The cutting tool 1 having such a shape is used as a cutting-edge-replaceable cutting tip, such as a cutting-edge-replaceable cutting tip for turning. The cutting tool 1 includes a rake face 1a, a flank face 1b, and a cutting edge portion 1c connecting rake face 1a and flank face 1b.

<Substrate>

Any substrate can be used as the substrate for the present embodiment as long as it is conventionally known as this kind of substrate. For example, the substrate preferably includes one selected from the group consisting of a cemented carbide (e.g., tungsten carbide-based (WC-based) cemented carbide, a cemented carbide including Co in addition to WC, a cemented carbide to which a carbonatite of Cr, Ti, Ta, Nb, and the like is added in addition to WC, etc.), a cermet (having TiC, TiN, TiCN or the like as a main component), high-speed steel, ceramics (TiC, SiC, SiN, AlN, $Al_2O_3$, etc.), a cubic boron nitride sintered body (cBN sintered body), and a diamond sintered body.

Among these various substrates, it is particularly preferable to select a cemented carbide (particularly a WC-based cemented carbide) or a cermet (particularly a TiCN-based cermet). The reason is that those substrates have a particularly excellent balance between hardness and strength at high temperatures, and excellent properties for the substrate of a cutting tool for the applications described above.

When using a cemented carbide as substrate, the effects of the present embodiment are exhibited even if such a cemented carbide includes free carbons or an irregular phase called an η phase in the structure. Further, substrate used in the present embodiment may have a modified surface. For example, in the case of a cemented carbide, a β-free, layer may be formed on the surface, and in the case of a cBN sintered body, a surface hardened layer may be formed. The effects of the present embodiment are exhibited even if the surface is modified in such a way.

When the cutting tool is a cutting-edge-replaceable cutting tip (cutting-edge-replaceable cutting tip for turning, cutting-edge-replaceable cutting tip for milling, etc.), the substrate may or may not include a chip breaker. The shape of the cutting edge portion may be any one of to a sharp edge (a ridge where the rake face and the flank face intersect), a honed edge (a sharp edge processed to be rounded), a negative land (chamfered), and a shape combining a honed edge and a negative land.

<Coated film>

Figure 3:
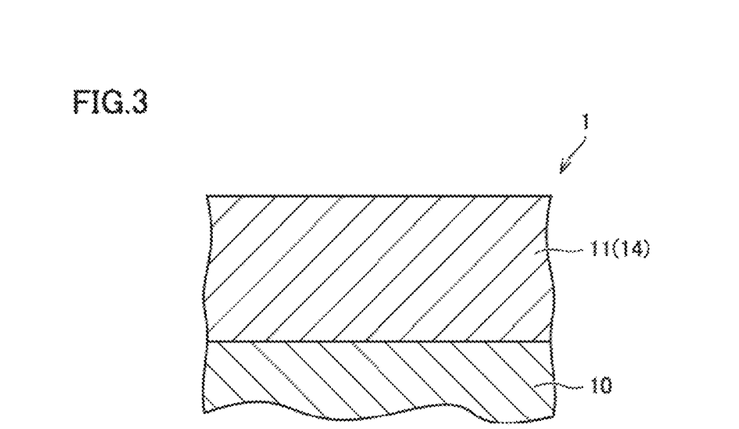
FIG. 3 is a schematic cross-sectional view illustrating an example of the cutting tool of the present disclosure.
Figure 4:
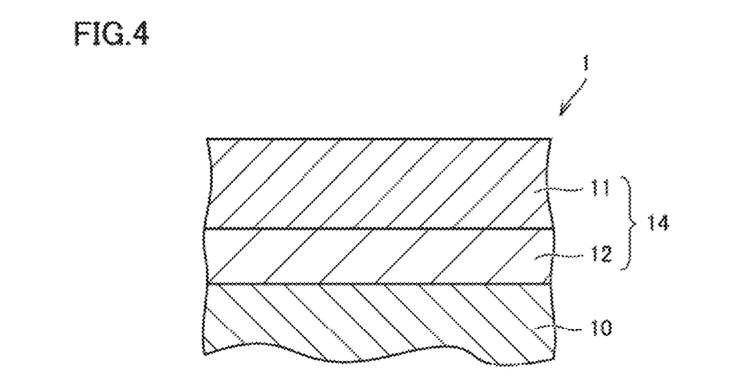
FIG. 4 is a schematic cross-sectional view illustrating another example of the cutting tool of the present disclosure.
Figure 5:
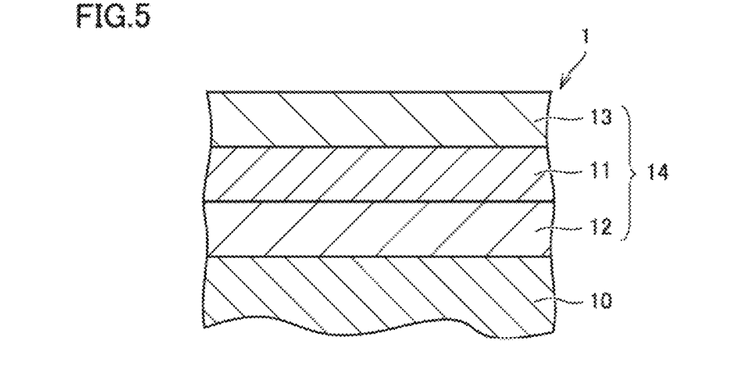
FIG. 5 is a schematic cross-sectional view illustrating yet another example of the cutting tool of the present disclosure.

FIG. 3 is a schematic cross-sectional view illustrating an example of the cutting tool of the present disclosure. FIG. 4 is a schematic cross-sectional view illustrating another example of the cutting tool of the present disclosure. FIG. 5 is a schematic cross- sectional view illustrating yet another example of the cutting tool of the present disclosure. A coated film 14 according to the present embodiment includes a first layer 11 (FIGS. 3 to 5). The "coated film" covers at least a part of the substrate (e.g., a part of the rake face) and thus has an improving effect on various properties of the cutting tool, such as peel resistance, defect resistance, and wear resistance. It is preferable that coated film 14 cover the entire surface of a substrate 10. However, even cases where a part of the substrate 10 is not covered with the coated film 14 or cases where the composition of the coated film 14 is partially different do not depart from the scope of the present embodiment. As used herein, "peel resistance" means resistance of the coated film 14 to peeling from the substrate 10.

The thickness of the coated film is preferably not less than 2 μm and not more than 25 μm, more preferably not less than 2 μm and not more than 18 μm, and further preferably not less than 3 μm and not more than 12 μm. As used herein, the thickness of the coated film means the sum of the thicknesses of layers constituting the coated film. Examples of the "layers constituting the coated film" include the above-described first layer and other layers described later as layers other than the first layer. The thickness of the coated film can be determined, for example, by measuring any 10 points in a cross-sectional sample parallel to the normal direction of the substrate surface using a transmission electron microscope (TEM), and taking the average value of the thicknesses measured at those 10 points. Examples of the cross-sectional sample include a sample obtained by thinly slicing a cross section of the cutting tool with an ion slicer apparatus. The same also applies when the thickness of each of the first layer and the other layers is measured. Examples of the transmission electron microscope include JEM-2100F (trade name) manufactured by JEOL Corporation.

The coated film includes the first layer. Further, in one example of the present embodiment, a plurality of the first layers may be provided as long as the effects obtained by the cutting tool are maintained. For example, if the coated film contains two first layers, the coated film may further comprise an intermediate layer (other layer) provided between the two first layers.

(First layer)

The first layer according to the present embodiment includes a plurality of crystal grains. The first layer may be composed of only the crystal grains described above, or may contain other components. Examples of the other components include TiN, TiC, $Al_2O_3$, TiCN, TiCNO, and TiBN.

(Crystal grain)

The crystal grain according to the present embodiment is composed of $Al_xTi_{1-x}C_yN_{1-y}$. As used herein, "crystal grain is composed of $Al_xTi_{1-x}C_yN_{1-y}$" is not limited to those consisting only of $Al_xTi_{1-x}C_yN_{1-y}$, and has a concept that it also encompasses those including components other than $Al_xTi_{1-x}C_yN_{1-y}$ along with $Al_xTi_{1-x}C_yN_{1-y}$ as long as the effects of the present disclosure are exhibited.

In this formula, x is more than 0.65 and less than 0.95. As a result, the cutting tool can have excellent heat resistance. Further x is preferably more than 0.7 and less than 0.95, more preferably more than 0.75 and less than 0.95, and further preferably more than 0.80 and less than 0.90.

In the above formula, y is not less than 0 and is less than 0.1. When a carbon content in the crystal grains is a trace amount of $0 \leq y < 0.1$, wear resistance is improved due to an improvement in the lubricating properties. On the other hand, when y is not in the above range, defect resistance and chipping resistance are worse, which is not preferable. Further, y is preferably not less than 0 and less than 0.08, more preferably not less than 0 and less than 0.06, and further preferably not less than 0 and less than 0.05. In addition, from a production viewpoint, the lower limit of y may be not less than 0.01, and may be not less than 0.02.

The fact that the crystal grains are composed of $Al_xTi_{1-x}C_yN_{1-y}$, where x is more than 0.65 and less than 0.95 and y is not less than 0 and less than 0.1, can be confirmed by using an EDX (energy dispersive X-ray spectroscopy) apparatus with an SEM or TEM. Specifically, first, an arbitrary position of the cutting tool is cut in the film thickness direction to prepare a sample including a cross section of the coated film. Next, for the first layer in the coated film, a rectangular measurement field of 2 μm ×2 μm is arbitrarily selected at five locations, and those regions are analyzed. The midpoint of the diagonal in the rectangle passes through the midpoint in the thickness direction of the first layer (the midpoint in the thickness direction between S1 or S2 described later and S3 described later), and a pair of two opposite sides of the rectangle are parallel to S3 described later. As a result, x and y, which indicate the atomic ratios of the respective elements included in the arbitrary measurement regions, can be identified, and the average value of each of x and y can be obtained to determine the composition of the crystal grains.

(Average aspect ratio of the crystal grains in the first region)

The average aspect ratio of the crystal grains is not more than 3.0 in the first region, where the first region is a region that is sandwiched between surface S1 of the first layer or interface S2 on the surface side of the first layer and a first virtual plane VS1. The first virtual plane VS1 passes through a point that is 1 μm away from surface S1 or interface S2 on the substrate side, and is parallel to surface S1 or interface S2. As a result, it is possible to suppress the grain boundaries of the crystal grains from extending in the film thickness direction in the first layer. Therefore, it is possible to suppress cracks from developing linearly in the film thickness direction in the first layer, and thus the cutting tool of the present embodiment can have excellent thermal cracking resistance in the rake face even when used for wet processing of gray cast iron. For the lower limit, the average aspect ratio is preferably not less than 1.0. Further, for the lower limit, the average aspect ratio can be not less than 1.2, and be not less than 1.4, from a production viewpoint. For the upper limit, the average aspect ratio is preferably not more than 2.5, more preferably not more than 2.0, and further preferably not more than 1.8. The average aspect ratio is preferably not less than 1.0 and not more than 3.0, more preferably not less than 1.0 and not more than 2.5, and further preferably not less than 1.0 and not more than 2.0.

(Average aspect ratio of the crystal grains in the second region)

The average aspect ratio of the crystal grains is more than 3.0 and not more than 10.0 in the second region, where the second region is a region that is sandwiched between the first virtual plane VS1 and interface S3 on a substrate side of the first layer. As a result, the first layer is strong against deformation in the shear direction of the cutting tool because the crystal grains tend to form a columnar structure in the film thickness direction. Therefore, the cutting tool of the present embodiment can have excellent wear resistance on the rake face and the flank face even when used for wet processing of gray cast iron. For the lower limit, the average aspect ratio is preferably not less than 4.0, more preferably not less than 5.0, and further preferably not less than 6.0. For the upper limit, the average aspect ratio is preferably not more than 9.0, more preferably not more than 8.0, and further preferably not more than 7.0. The average aspect ratio is preferably more than 3.0 and not more than 9.0, more preferably not less than 4.0 and not more than 9.0, and further preferably not less than 4.0 and not more than 8.0.

<Method for measuring the average aspect ratio of the crystal grains in each of the first and second regions>

The average aspect ratio of the crystal grains in the first region and the average aspect ratio of the crystal grains in the second region are measured on a cross section along the normal to the interface between the substrate and the coated film. The specific measurement method is as described in the following (A1) to (A7).

(A1) A cutting tool sample is embedded in an epoxy resin and then polished. The polished cutting tool is cut using a cross-section polisher (manufactured by JEOL) at 6 kV for 6 hours, and then finished at 1.5 kV for 1 hour. The cutting is carded out in a direction along a normal of the surface of the cutting tool. The normal to the surface of the cutting tool and the normal to the interface between the substrate and the coated film are substantially parallel. Therefore, by this cutting, a cross section along the normal to the interface between the substrate and the coated film of the first layer is obtained.

As long as the cutting is carried out at a position that is not less than 0.1 mm away from the cutting edge portion in a direction parallel to the cutting tool surface, the cutting can be performed at any site of the cutting tool on either the rake, face or the flank face.

(A2) EBSD analysis is performed on the cross section under the following measurement conditions using an electric field emission scanning electron microscope (FE-SEM) (trade name: "SUPRA35VP", manufactured by Carl Zeiss) equipped with an electron beam backscattering, diffraction device (EBSD device).

(Measurement conditions)
Acceleration voltage: 15 kV
Current value: 1.8 nA
Irradiation current: 60 μm (with HC)
Exp: Long 0.03 s
Binning: 8×8
WD: 15 mm
Tilt: 70°
Step size: 0.02 μm
BKD: Background Subtraction, Dynamic Background Subtraction, Normalize intensity histogram
Magnification: 20,000 ×
Grain boundary definition: Not less than 15°

For the EBSD analysis, data collection is performed on the cross section of at least a surface region (observation region) having a length including everything from the surface S1 of the first layer or the interface S2 on the surface side of the first layer to the interface S3 on the substrate side (length including the entire thickness of the first layer) ×10 μm (length in the direction parallel to the interface S3 on the substrate side of the first layer).

The data collected by the EBSD analysis was cleaned up by recognizing only the data satisfying CI>0.1 by CI Dilation (single iteration) and Grain CI Standardization. The CI value is calculated by a Voting method. Specifically, the CI value is obtained by CI=(V1~V2)/Videal (V1, 2 : the first, the second solutions, Videal: ideal solution).

Figure 6:
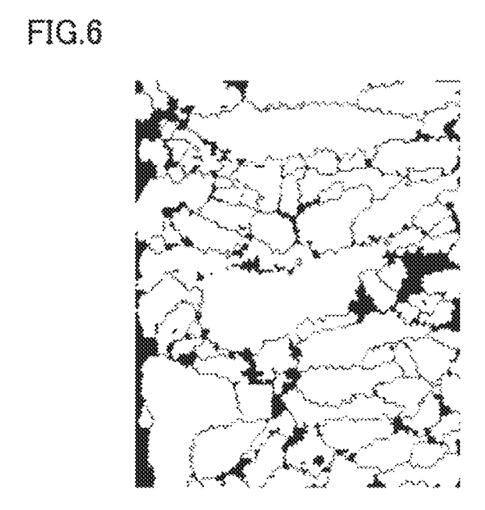
FIG. 6 is an example of an IPF map created for an example of the cutting tool of the present disclosure.

(A3) The EBSD analysis results are analyzed using commercially available software (trade name: "OMI7.1", by TSL Solutions Co,. Ltd.) to create an IPF map (inverse pole figure map). In the creation of the IPE map, cases where the misorientation angle to the adjacent measurement point is not less than 15° are defined as the crystal grain boundary. The IPF map shows the shape of each crystal grain, and the orientation of each crystal grain is color-coded. An example of the IPF map created for the cutting tool of the present embodiment is shown in FIG. 6. In FIG. 6, the region shown in black indicates CI≤0.1. That is, the region shown in black in FIG. 6 means a region where the shape of each crystal grain is not recognized by performing the above-described clean-up processing. In FIG. 6, the left side of the page is the surface side of the cutting tool, and the right side of the page is the substrate side of the cutting tool.

(A4) The schematic cross-sectional diagram of FIG. 8 is a schematic cross-sectional view illustrating an example of the cutting tool of the present disclosure. Description will be made below with reference to FIG. 8. On the IPF map, first, surface S1 of first layer 11 or interface S2 on the surface side of first layer 11 (in FIG. 8, since no other layers are formed on first layer 11, interface S2 is indicated by the reference sign (S2)) and first virtual plane VS1 are set by the setting method described below. Next, a measurement region (first region R1) having a length including everything up to the VS1 from the S1 or the S2 (length in the film thickness direction of first layer 11) ×10 μm (length in the direction parallel to interface S3 on the substrate side of first layer 11) is set. On the IPF map, the method for setting the S1, the S2, and the VS1 are as follows. (Method for setting S1, S2, and VS1) S1: When the surface of the first layer is a smooth surface, the smooth surface is set as S1. When the surface of the first layer has a uneven shape, first, a virtual line VL1 (not shown) is set that, on the IPF map, passes through at least one point on the surface of the first layer, is parallel to the interface between the coated film and the substrate, and has the longest distance from the interface between the coated film and the substrate, and a virtual line VL2 (not shown) is set that passes through at least one point on the surface of the first layer, is parallel to the interface between the coated film and the substrate, and has the shortest distance from the interface between the coated film and the substrate. Next, a straight line that is the same distance from the VL1 as the distance from the VL2 and is parallel to the interface between the coated film and the substrate is set as the position of S1 on the IPF map. On the IPF map, the smooth surface and the uneven shape can he recognized by recognizing the smooth surface or the uneven shape on an SEM image having the same field of view as the IPF map, and then superimposing the SEM image in which the smooth surface or the uneven shape is recognized on the IPF map. The SEM image is obtained by using the above-described FE-SEM. S2: Line analysis is performed in the thickness direction of the coated film from an arbitrary point on the coated film surface. The line analysis is performed by EDX (energy dispersive X-ray spectroscopy) apparatus equipped with an SEM. Further, in the line analysis, the beam diameter is set to 0.9 nm, the scan interval is set to 0.1 μm, and the acceleration voltage is set to 15 kV. As a result, a point indicating the maximum value of the ratio of the number of atoms of the metal element specific to the first layer in the first layer (e g., if the upper layer in contact with the first layer is $Al_2O_3$, the element Ti) is identified. Next, among the points indicating half the maximum value, a point P1 (not shown) that is located on the surface side from the point indicating the maximum value and that is closest to the point indicating the maximum value is specified. Next, an arbitrary other point on the coated film surface is selected, and in the same manner, among the points indicating half the maximum value of the ratio of the number of atoms of the metal element specific to the first layer in the first layer (e.g., if the upper layer in contact with the first layer is $Al_2O_3$, the element Ti), a point P2 (not shown) that is located on the surface side from the point indicating the maximum value and that is closest to the point indicating the maximum value is specified. Next, a straight line connecting the P1 and the P2 is set as the position of S2 on the IPF map.

VS1: A plane that passes through a point that is 1 μm away from the S1 or the S2 on the substrate side and is parallel to the S1 or the S2 is set as first virtual plane VS1.

(A5) Referring to FIG. 8, interface S3 on the substrate side of the first layer is set on the IPF map according to the setting method described below. Next, a first virtual line L1 that passes through a point that is 0.3 μm away from S3 on the S1 or the S2 side and is parallel to S3 is set. Next, a measurement region (second region R2) having a length including everything up to the L1 from the VS1 (length in the film thickness direction of first layer 11) ×10 μm (length in the direction parallel to interface S3 on substrate 10 side of first layer 11) is set. On the IPF map, the method for setting S3 is as follows.

(Method for setting S3) S3: Line analysis is performed in the thickness direction of the coated film from an arbitrary point on the coated film surface. The line analysis is performed by EDX (energy dispersive X-ray spectroscopy) apparatus equipped with an SEM. Further, in the line analysis, the beam diameter is set to 0.9 nm, the scan interval is set to 0.1 μm, and the acceleration voltage is set to 15 kV. As a result, a point indicating the maximum value of the ratio of the number of atoms in the first layer of the metal element specific to the first layer (e.g., if the lower layer in contact with the first is TiN, the element Al) is identified. Next, among the points indicating half the maximum value, a point P3 (not shown) that is located on the substrate side from the point indicating the maximum value and that is closest to the point indicating the maximum value is specified. Next, an arbitrary other point on the coated film surface is selected, and in the same manner, among the points indicating half the maximum value of the ratio of the number of atoms of the metal element specific to the first layer (eg., if the lower layer in contact with the first layer is TiN, the element Al), a point P4 (not shown) that is located on the substrate side from the point indicating the maximum value and that is closest to the point indicating the maximum value is specified. Next, a straight line connecting the P3 and the P4 is set as the position of S3 on the IPF map.

Figure 9:
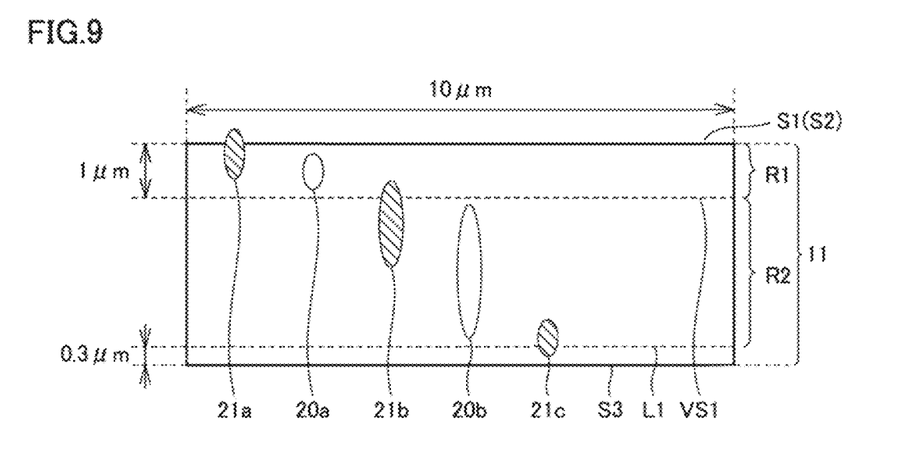
FIG. 9 is a schematic cross-sectional view illustrating an example of the first layer in the cutting tool of the present disclosure.

(A6) FIG. 9 is a schematic cross-sectional view illustrating an example of the first layer in the cutting tool of the present disclosure. The following description is made with reference to FIG. 9. The total area of first region R1 and the sum of the area of crystal grains 20a included in the measurement region (first region R1) are determined. Next, the ratio of the sum of the area of crystal grains 20a included in the measurement region (first region R1) to the total area of first region R1 (including the region shown in black in FIG. 6) is determined.

After confirming that the above ratio is not less than 25%, the following (A7) is carried out. This check is performed for the following reason: when the above ratio is less than 25%, there are many crystal grains 21b straddling VS1 shown in FIG. 9, that is, the entire first layer forms a columnar crystal, which means that the crystal grains inevitably form a columnar structure over the entire region in the film thickness direction of the first layer, and as a result it is considered that the average aspect ratio of the crystal grains is more than 3.0 in first region R1.

Here, the total area of first region R1 is determined by the length including everything from S1 or S2 to VS1 (the length in the film thickness direction of first layer 11) ×10 μm (the length in the direction parallel to the interface S3 on substrate 10 side of first layer 11). Further, the sum of the area of crystal grains 20a included in the measurement region (first region R1) is determined by analyzing the crystal grains extracted under the above-described EBSD measurement conditions using commercially available software (trade name "OIM7.1", by TSL Solutions Co., Ltd.). Here, the crystal grains 20a included in the measurement region (first region R1) are crystal grains in which the entire crystal grain is present only in the measurement region (first region R1). In other words, as illustrated in FIG. 9, crystal grains 21a that straddle S1 or S2 and crystal grains 21b that straddle VS1 are distinguished from crystal grains 20a included in the measurement region (first region R1).

(A7) The aspect ratio of each crystal grain 20a included in the measurement region (first region R1) is measured, and the average value thereof is calculated. This aspect ratio average value corresponds to "the average aspect ratio of the crystal grains in first region R1". The aspect ratio of each crystal grain 20b included in the measurement region (second region R2) is measured, and the average value thereof is calculated. This aspect ratio average value corresponds to "the average aspect ratio of the crystal grains in second region R2". As used herein, the aspect ratio is defined as a value obtained by dividing a maximum diameter a of a crystal grain by a minor diameter b of the crystal grain. Maximum diameter a of the crystal grain is defined as the maximum value of d determined from all combinations of $(x_i, y_j)$ and $(x_j, y_j)$ in one crystal grain, among the values of d expressed by the calculation formula "$d^2=(x_i-x_j)^2 \div (y_i-y_j)^2{}_N$" in which the coordinate positions of pixels around the outermost circumference of the crystal grain are $(x_i, y_i)$ and $(x_j, y_j)$. Minor diameter b of the crystal grain is a numerical value calculated from the calculation formula "b=A (particle area of crystal grain) / πa". Here, as illustrated in FIG. 9, the crystal grains 20b included in the measurement region (second region R2) are the crystal grain that are present only in the measurement region (second region R2). In other words, as illustrated in FIG. 9, crystal grains 21b that straddle VS1 and crystal grains 21c that straddle L1 are distinguished from the crystal grains 20b included in the measurement region (second region R2).

It has been confirmed that the same result can be obtained even by arbitrarily selecting a different measurement range in the same cutting tool and performing the above-described measurement in that measurement range.

(Ratio of the area occupied by the crystal grains having a cubic crystal structure)

The above-described crystal grains include crystal grains having a cubic crystal structure. Further, in the first layer, the ratio of the area occupied by the crystal grains having a cubic crystal structure is not less than 90%. As a result, the first layer has a high hardness, and the cutting tool can have excellent wear resistance. For the lower limit, the area ratio is preferably not less than 92%, more preferably not less than 95%, and further preferably not less than 98%. For the upper limit, the area ratio is preferably not more than 100%. For the upper limit, the area ratio may be not more than 99% from a production viewpoint. The area ratio is preferably not less than 90% and not more than 100%, more preferably not less than 95% and not more than 100%, and further preferably not less than 98% and not more than 100% <Method for measuring the ratio of the area occupied by the crystal grains having a cubic crystal structure>

In the first layer, the ratio of the area occupied by the crystal grains having a cubic crystal structure is measured on a cross section along a normal to the interface between the substrate and the coated film. The specific measurement method is as described in the following (B1) to (B4).

(B1) EBSD analysis is performed on a cross section of the cutting tool in the same matter as in (A1) and (A2) described in the "Method for measuring the average aspect ratio of the crystal grains in each of the first and second regions" above.

Figure 7:
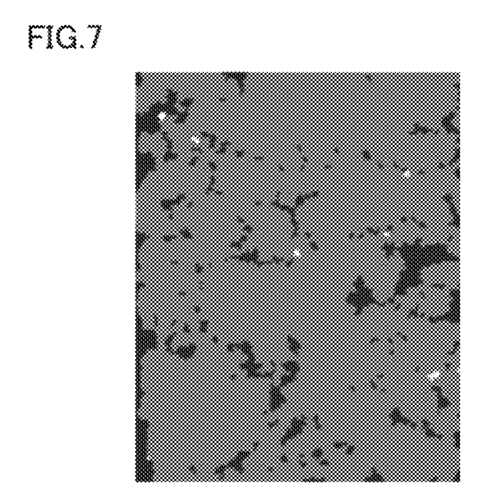
FIG. 7 is an example of a crystal phase map created for an example of the cutting tool of the present disclosure.

(B2) The EBSB analysis results are analyzed using commercially available software (trade name: "OIM7.1", by TSL Solutions Co., Ltd.) to create a crystal phase (Phase) map. As shown in FIG. 7, the crystal phase map shows the crystal system of each crystal grain in a different color. In the present embodiment, cubic and hexagonal crystal systems are mainly shown. In FIG. 7, the region shown in black indicates CI≤0.1. That is, the region shown in black in FIG. 7 means a region where the crystal system of each crystal grain is not recognized by performing the above-described clean-up processing. In FIG. 7, the left side of the page is the surface side of the cutting tool, and the right side of the page is the substrate side of the cutting tool.

(B3) On the crystal phase (Phase) map, first, surface S1 of first layer 11 or interface S2 on the surface side of first layer 11, and interface S3 on the substrate side of the first layer are set by the same setting method as described above, as illustrated in FIG. 8. Next, a first virtual line L1 that passes through a point that is 0.3 μm away from S3 on the S1 or S2 side and is parallel to S3 is set. Next, a measurement region having a length including everything up to L1 from S1 or S2 (length in the film thickness direction of first layer 11) ×10 μm (length in the direction parallel to interface S3 on substrate 10 side of first layer 11) is set.

(B4) In the measurement region, the percentage of the area of the cubic crystal system crystal grains with respect to the area of all the regions showing a crystal system is calculated. The percentage corresponds to the "ratio of the area occupied by the crystal grains having a cubic crystal structure in the first layer". As used herein, "all the regions showing a crystal system" means "the reminding regions after excluding regions where a crystal system cannot be determined from the measurement region".

It has been confirmed that the same result can be obtained even by arbitrarily selecting a different measurement range in the same cutting tool and performing the above-described measurement in that measurement range.

(Compressive residual stress of first layer)

It is preferable that the first layer have a compressive residual stress of not less than 1.0 GPa and less than 4.5 GPa. As a result, the development of cracks that occurred during processing can be suppressed, and therefore the thermal cracking resistance of the cutting tool can be further improved. For the lower limit, the compressive residual stress is preferably not less than 1.0 GPa, More preferably not less than 2.0 GPa and further preferably not less than 2.5 GPa. For the upper limit, the compressive residual stress is preferably less than 4.5 GPa. For the upper limit, the compressive residual stress can be less than 4.0 GPa, to be less than 3.5 GPa, from a production viewpoint. Moreover, the compressive residual stress is more preferably not less than 2.0 GPa and less 4.5 GPa, and further preferably not less than 2.5 GPa and less than 4.5 GPa.

<Method for measuring the compressive residual stress of the first layer>

The compressive residual stress can be calculated, for example, by the 2θ-sin2 ψ method (side tilt method) using X-rays. The measurement conditions are as described below. For example, the average value of the compressive residual stress at any 3 or more positions within 5 mm from the honing position of the rake face of the cutting tool toward the center position of the tool is calculated.

(Measurement conditions)

X-ray output: 8.04 keV
X-ray source: Synchrotron radiation
Measuring plane: (200) plane
Detector: Flat panel
Concentration size: 1.5 mm ×0.5 mm
Scan axis: 2θ/θ
Scan mode: CONTINUOUS (Hardness of first layer)

It is preferable that the first layer have a hardness of not less than 30 GPa and not more than 40 GPa. As a result, the wear resistance of the cutting tool can be further improved. For the lower limit, the hardness is preferably not less than 30 GPa, more preferably not less than 31 GPa, and further preferably not less than 32 GPa. For the upper limit, the hardness is preferably not more than 40 GPa, more preferably not more than 39 GPa, and further preferably not more than 38 GPa. The hardness is more preferably not less than 31 GPa and not more than 40 GPa, and further preferably not less than 32 GPa and not more than 39 GPa.

<Method for measuring the hardness of the first layer>

The hardness is measured in accordance with ISO 14577, and the measurement load is 10 mN (1 g).

(Thickness of the first layer)

The thickness of the first layer according to the present embodiment is not less than 2 μm and not more than 20 μm. As a result, wear resistance can be increased. For the lower limit, the thickness of the first layer is preferably not less than 3 μm, more preferably not less than 4 μm, and further preferably not less than 5 μm. For the upper limit, the thickness of the first layer is preferably not more than 12 μm, more preferably not more than 10 μm, and further preferably not more than 8 μm. The thickness of the first layer is preferably not less than 2 μm and not more than 12 μm, and further preferably not less than 3 μm and not more than 10 82 m.

(Other layers)

As long as the effects of the present embodiment are not impaired, the coated film may further include other layers mentioned above. As illustrated in FIGS. 4 and 5, examples of the other layers include a base layer 12 and a surface layer 13.

(Base Layer)

Base layer 12 is arranged between substrate 10 and first layer 11. Examples of the base layer include a TiN layer. The average thickness of the base layer is preferably not less than 0.1 μm and not more than 20 μm. As a result, the coated film can have excellent wear resistance and defect resistance. In addition, the average thickness of the base layer is more preferably not less than 0.2 μm and not more than 8 μm, and further preferably not less than 0.5 μm and not more than 5 μm.

(Surface layer)

It is preferable that surface layer 13 includes any one of a carbide, a nitride or a boride of Ti (titanium) as the main component, for example. Surface layer 13 is the layer arranged on the topmost surface side of coated film 14. However, in some cases surface layer 13 is not formed in the cutting edge portion. The surface layer is arranged, for example, directly above the first layer.

The meaning of "include any one of a carbide, a nitride or a boride of Ti (titanium) as the main component" is that not less than 90 mass% of any one of a carbide, nitride, and boride of Ti is included. Further, this expression preferably means consisting of any one of a carbide, nitride, or boride of Ti, excluding inevitable impurities.

Among the any of a carbide, nitride, and carbonatite of Ti, it is particularly preferable to make the surface layer of nitride of Ti (i.e., a compound represented by TiN) as the main component. Since TiN has the clearest (golden) color among these compounds, it has the advantage that corner identification (identification of a used site) of the cutting tip after use for cutting is easy. The surface layer is preferably a TiN layer.

The surface layer has an average thickness of preferably not less than 0.05 μm and not more than 1 μm. As a result, the adhesion between the surface layer and an adjacent layer is improved. The average thickness of the surface layer is more preferably not less than 0.1 μm and not more than 0.8 μm, and further preferably not less than 0.2 μm and not more than 0.6 μm.

[Second Aspect: Method for producing a cutting tool]

The method for producing a cutting tool according to the present embodiment includes:

a first step of providing the substrate (hereinafter, also simply referred to as "first step"), and a second step of forming the coated film on the substrate using chemical vapor deposition (CVD) (hereinafter, also simply referred to as "second step").

The second step includes spraying an aluminum halide gas, a titanium halide gas, ammonia gas, and hydrogen gas onto the substrate in an atmosphere at not less than 650°C. and not more than 900° C. and not less than 0.1 kPa and not more than 30 kPa. The production method can further include a third step of performing blast processing on the coated film obtained by the second step (hereinafter, also simply referred to as "third step").

<Step 1: Step of providing the substrate>

In the first step, the substrate is provided. For example, a cemented carbide substrate is provided as substrate. The cemented carbide substrate may be a commercially available product or may he produced by a common powder metallurgy method. In the case of producing the substrate by a common powder metallurgy method a mixed powder is obtained, for example, by mixing a WC powder, a Co powder and the like by a ball mill or the like. The mixed powder is dried, and then a molded body is obtained by molding into a predetermined shape (for example, SEETI3T3AGSN-G, etc.). Further, by sintering the molded body, a WC-Co-based cemented carbide (sintered body) is obtained. Next, a substrate made of a WC-Co-based cemented carbide can be produced by subjecting the sintered body to predetermined cutting edge processing, such as honing. In the first step, even for substrates other than the above, any substrate conventionally known as this kind of substrate can be provided.

<Second step: Step of forming the coated film on the substrate>

In the second step, the coated film including the first layer is formed on the substrate using a CVD method. Specifically, an aluminum halide gas, a titanium halide gas, ammonia gas (hereinafter, these gases are collectively referred to as "starting material gases"), and a carrier gas are sprayed onto the substrate in an atmosphere at not less than 650°C. and not more than 900°C. and not less than 0.1 kPa and not more than 30 kPa to form the coated film including the first layer. As a result, the cutting tool of the present embodiment is obtained. This step can be performed using, for example, the CVD apparatus described below.

(CVD apparatus)

Figure 10:
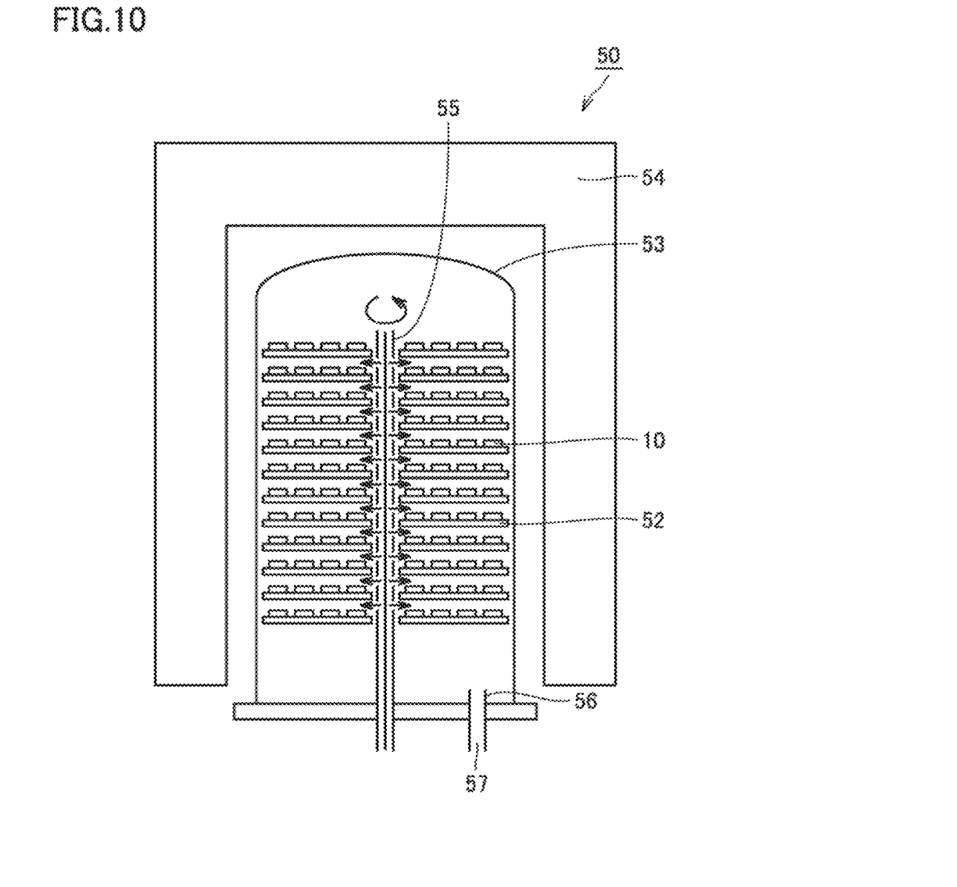
FIG. 10 is a schematic cross-sectional view of a CVD apparatus used in the production of the cutting tool of the present disclosure.

FIG. 10 is a schematic cross-sectional view of an example of a CVD apparatus 50 used in the production of the cutting tool of the present embodiment. As illustrated in FIG. 10. CVD apparatus 50 includes a substrate-setting jig 52, which is for mounting substrate 10, and a reaction vessel 53 made of a heat-resistant alloy steel, which contains substrate-setting jig 52. Further, a temperature control device 54 for controlling the temperature in reaction vessel 53 is provided around reaction vessel 53. In the present embodiment, substrate 10 is preferably mounted on a protrusion provided in substrate-setting jig 52. By mounting in this way, it is possible to uniformly deposit the film on each of the rake face, the flank face, and the cutting edge portion.

In reaction vessel 53, a gas introduction tube 55 extends the space inside reaction vessel 53 in a vertical direction, and is arranged so that it can be rotated in the vertical direction. Gas introduction tube 55 is provided with a plurality of through holes for spraying gas onto the tool substrate. In the present embodiment, it is preferable that a sufficient gap be provided between the through holes and substrate 10 for spraying the above-described gases. By doing so, it is possible to prevent turbulence from occurring.

Further, reaction vessel 53 is provided with a gas exhaust tube 56 for exhausting the internal gases to the outside. The gases inside reaction vessel 53 pass through gas exhaust tube 56 and are discharged from a gas exhaust port 57 to the outside of the reaction vessel 53.

The atmosphere in reaction vessel 53 is at not less than 650° C. and not more than 900° C. (preferably not less than 700° C. and not more than 770° C.), and not less than 0.1 kPa and not more than 30 kPa (preferably not less than 0.2 kPa and not more than 5.0 kPa). Since a plurality of through holes are opened in gas introduction tube 55, the introduced gases are each sprayed from a different through hole into reaction vessel 53. At this time, gas introduction tube 55 rotates at a rotational speed of, for example, 2 to 4 rpm, around the above-described axis as indicated by the rotation arrow. As a result, it is possible to evenly spray the substrate.

Examples of the aluminum halide gas include aluminum chloride gas ($AlCl_3$ gas, $Al_2Cl_6$ gas). Preferably, $AlCl_3$ gas is used. The concentration (% by volume) of the aluminum halide gas is preferably not less than by volume and not more than 1.0% by volume, and more preferably not less than 0.2% by volume and not more than 0.8% by volume, based on the total volume of all the gases introduced into the reaction vessel (hereinafter, also referred to as "total volume of the introduced gases")

Examples of the titanium halide gas include titanium(IV) chloride gas ($TiCl_4$ gas), and titanium(III) chloride gas ($TiCl_3$ gas). Preferably, titanium(IV) chloride gas is used. The concentration (% by volume) of the titanium halide gas is preferably not less than 0.05% by volume and not more than 0.3% by volume, and more preferably not less than 0.1% by volume and not more than 0.2% by volume, based on the total volume of the introduced gases.

The concentration (% by volume) of the ammonia gas is preferably not less than 0.2% by volume and not more than 3.0% by volume, and more preferably not less than 0.5% by volume and not more than 2.0% by volume, based on the total volume of the introduced gases.

In addition to the starting material gases, ethylene gas ($C_2H_4$) can be used. The concentration (% by volume) of the ethylene gas is preferably not less than 0% by volume and not more than 0.3% by volume, based on the total volume of the introduced gases.

Examples of the carrier gas include argon gas, and hydrogen gas. Preferably, hydrogen gas is used. The gas concentration (% by volume) of the carrier gas is preferably not less than 90% by volume and not more than 99% by volume, and more preferably not less than 95% by volume and not more than 99% by volume, based on the total volume of the introduced gases.

In the second step, first, the second region is formed by keeping the flow rate of the starting material gases and the carrier gas constant while keeping the total gas flow rate of the introduced gas constant (hereinafter, also referred to as "second step A"). As a result, the average aspect ratio of the crystal grains can be more than 3.0 and not more than 10.0 in the second region. The reason for this is surmised as follows.

When the gas velocity is constant in the deposition of an AlTiCN film by CVD method, the probability of adsorbing to a specific crystal face is high, so the crystal grains tend to grow in a column shape. As a result, it is surmised that the aspect ratio of the crystal grains increases.

The thickness of the second region is adjusted by the deposition time. The total gas flow rate in second step A can be, for example, a point in the range of 80 to 120 L/min.

Following second step A, the first region is formed while varying the flow rate of the carrier gas to thereby vary the total gas flow rate of the introduced gases under the conditions described later (hereinafter, also referred to as "second step B"). As a result, the average aspect ratio of the crystal grains can be not more than 3.0 in the first region. The reason for this is surmised as follows. follows As stated above, when the gas velocity is constant in the deposition of an AlTiCN film by CVD method, the probability of adsorbing to a specific crystal face is high, so the crystal grains tend to grow in a column shape. On the other hand, when the flow rate of the entire introduced gases is varied by varying the flow rate of the carrier gas during film deposition, the probability that the starting material gases adsorb to a specific crystal face decreases, and so it is surmised that the aspect ratio of the crystal grains becomes smaller because the crystal grains are less likely to grow in a column shape. The fact that the average aspect ratio of the crystal grains can be set to not more than 3.0 by varying the total gas flow rate of the introduced gases is a new finding by the present inventors.

Conventionally, since an AlTiCN film is deposited under a high vacuum, it is difficult to control the pressure. Therefore, it was common to set the gas velocity to be constant. It was thought that if the gas velocity is varied during the deposition of the AlTiCN film to result in large pressure fluctuation, the problem of easily forming defects in the AlTiCN film arises, for example. Therefore, the method specific to the present embodiment, specifically, varying the gas flow rate during the deposition of the AlTiCN film, has not been employed by those skilled in the art.

In second step B, the total gas flow rate of the gases introduced into the reaction vessel can be varied, for example, Wider the following conditions. As used herein, the "total gas flow rate" refers to the total volume flow rate of the gases introduced into the CVD furnace per unit time, wherein gases in a standard state (0° C. and 1 atm) are considered as the ideal gas.

Flow rate (average): 100 L/min

Flow rate (range of variation): 80 to 120 L/min

Cycle: 5 to 15 minutes (after 15 minutes, the aspect ratio tends increase in the first region.)

When the total gas flow rate is in the above range, the flow rate of the carrier gas in the introduced gases can be as follows, for example.

Flow rate (average): 98% by volume

Flow rate (range of variation): 97 to 99% by volume

Cycle: 5 to 15 minutes

The second step can include a step of forming another layer such as a base layer and a surface layer, in addition to second step A and second step B, which are steps for forming the first layer. These other layers can be formed by conventional methods.

<Third step: Step of performing blasting treatment>

In this step, the coated film is blasted. Examples of the conditions for the blasting treatment include the following conditions. By performing the blasting treatment, the desired compressive residual stress can be imparted to the coated film.

(Blasting treatment conditions)
Media: Alumina particles, 500 g
Blast angle: 45°
Blast distance: 30 to 100 mm
Blast time: 2 to 8 seconds
Blast pressure: 0.1 to 0.3 MPa
Rotational speed: 60 rpm <Other steps>

In the production method according to the present embodiment, a surface treatment step and others may be performed as appropriate, in addition to the above-described steps.

[Examples]

The present embodiment will now be described more specifically by way of examples. However, the present embodiment is not limited to these examples.

<<Production of cutting tool>>

In order to produce the cutting tool of Sample Nos. 1 to 20, cemented carbide cutting tips (manufactured by Sumitomo Electric Hardmetal Co., Ltd.) having a blending composition of 2.0% by weight of TaC, 1.0% by weight of NbC, 10.0% by weight of Co, and a balance of WC (including impurities), and having a SEETI3T3AGSN-G shape, were provided as a substrate (first step).

Next, the coated film was formed on the surface of the substrate (second step). Specifically, for Sample Nos. 1 to 19, CVD method was first carried out on the entire surface of the substrate under the base layer formation conditions shown in Table 1. Next, for Sample Nos. 1 to 19, CVD method was carried out on the entire surface of the formed base layer under the first layer formation conditions shown in Table 2 (second step A), and then CVD method was carried out under the first layer formation conditions shown in Table 3 (second step B). For Sample No 20, CVD method was carried out on the entire surface of the substrate under the first layer formation conditions shown in Table 2 (second step A), and then CVD method was carried out under the first layer formation conditions shown in Table 3 (second step B). The deposition time in the second step A and the second step B was adjusted so that the thickness of the entire first layer is as shown in the column "thickness of first layer (μm)" of Tables 6 and 7. Next, for Sample No. 19, CVD method was carried out under the surface layer formation conditions shown in Table 4. As a result of the above, the second step was carried out.

[Table 1]

TABLE 1

| Sample No. | Ratios of starting material gases (% by volume) | | | Temperature (° C.) | Pressure (kPa) | Total gas flow rate (L/min) |
|---|---|---|---|---|---|---|
| | $TiCl_4$ | $N_2$ | $H_2$ | | | |
| 1 | 1.50 | 30 | balance | 850 | 15 | 100 |
| 2 | 1.50 | 30 | balance | 850 | 15 | 100 |
| 3 | 1.50 | 30 | balance | 350 | 15 | 100 |
| 4 | 1.50 | 30 | balance | 850 | 15 | 100 |
| 5 | 1.50 | 30 | balance | 850 | 15 | 100 |
| 6 | 1.50 | 30 | balance | 850 | 15 | 100 |
| 7 | 1.50 | 30 | balance | 850 | 15 | 100 |
| 8 | 1.50 | 30 | balance | 850 | 15 | 100 |
| 9 | 1.50 | 30 | balance | 850 | 15 | 100 |
| 10 | 1.50 | 30 | balance | 850 | 15 | 100 |
| 11 | 1.50 | 30 | balance | 850 | 15 | 100 |
| 12 | 1.50 | 30 | balance | 850 | 15 | 100 |
| 13 | 1.50 | 30 | balance | 850 | 15 | 100 |
| 14 | 1.50 | 30 | balance | 850 | 15 | 100 |
| 15 | 1.50 | 30 | balance | 850 | 15 | 100 |
| 16 | 1.50 | 30 | balance | 850 | 15 | 100 |
| 17 | 1.50 | 30 | balance | 850 | 15 | 100 |
| 18 | 1.50 | 30 | balance | 850 | 15 | 100 |
| 19 | 1.50 | 30 | balance | 850 | 15 | 100 |
| 20 | — | — | — | — | — | — |

[Table 2]

TABLE 2

| Sample No. | Formation method | Substrate temperature (° C.) | Pressure in reaction vessel (kPa) | Total gas flow rate (L/min) | Ratios of introduced gases | | | | | Cycle Minutes |
|---|---|---|---|---|---|---|---|---|---|---|
| | | | | | $AlCl_3$ Average % by volume | $TiCl_4$ Average % by volume | $NH_3$ Average % by volume | $C_2H_2$ Average %by volume | $H_2$ Average % by volume | |
| 1 | CVD | 750 | 0.5 | 100 | 0.81 | 0.19 | 0.5 | 0 | balance | — |
| 2 | CVD | 750 | 0.5 | 100 | 0.53 | 0.11 | 0.5 | 0 | balance | — |
| 3 | CVD | 750 | 0.5 | 100 | 0.53 | 0.16 | 0.7 | 0 | balance | — |
| 4 | CVD | 750 | 1.0 | 100 | 0.58 | 0.14 | 1.3 | 0.2 | balance | — |
| 5 | CVD | 720 | 1.0 | 100 | 0.62 | 0.14 | 1.0 | 0.3 | balance | — |
| 6 | CVD | 720 | 3.0 | 100 | 0.62 | 0.05 | 0.5 | 0.3 | balance | — |
| 7 | CVD | 720 | 3.0 | 100 | 0.62 | 0.08 | 1.0 | 0 | balance | — |
| 8 | CVD | 720 | 3.0 | 100 | 0.53 | 0.13 | 1.0 | 0.3 | balance | — |
| 9 | CVD | 740 | 2.0 | 100 | 0.65 | 0.31 | 1.0 | 0 | balance | — |
| 10 | CVD | 740 | 2.0 | 100 | 0.74 | 0.14 | 1.0 | 0.7 | balance | — |
| 11 | CVD | 740 | 2.0 | 100 | 0.65 | 0.37 | 1.0 | 0 | balance | — |
| 12 | CVD | 740 | 2.0 | 100 | 0.58 | 0.11 | 1.0 | 0.8 | balance | — |
| 13 | CVD | 720 | 1.0 | 80-120 | 0.71 | 0.15 | 1.0 | 0.3 | balance | 13 |
| 14 | CVD | 720 | 0.5 | 100 | 0.62 | 0.14 | 1.0 | 0 | balance | — |
| 15 | CVD | 720 | 1.0 | 100 | 0.49 | 0.11 | 1.4 | 0.3 | balance | — |
| 16 | CVD | 720 | 3.0 | 100 | 0.57 | 0.02 | 0.8 | 0 | balance | — |
| 17 | CVD | 730 | 3.0 | 100 | 0.67 | 0.11 | 1.5 | 0 | balance | — |
| 18 | CVD | 720 | 3.0 | 100 | 0.68 | 0.12 | 1.0 | 0 | balance | — |
| 19 | CVD | 750 | 0.5 | 100 | 0.53 | 0.11 | 0.5 | 0 | balance | — |
| 20 | CVD | 750 | 0.5 | 100 | 0.81 | 0.19 | 0.5 | 0 | balance | — |

[Table 3]

TABLE 3

| Sample No. | Formation method | Substrate temperature (° C.) | Pressure is reaction vessel (kPa) | Total gas flow rate (L/min) | Ratios of introduced gases | | | | | Cycle Minutes |
| --- | --- | --- | --- | --- | --- | --- | --- | --- | --- | --- |
| | | | | | AlCl₃ Average % by volume | TiCl₄ Average % by volume | NH₃ Average % by volume | C₂H₂ Average %by volume | H₂ Average % by volume | |
| 1 | CVD | 750 | 0.5 | 80-120 | 0.81 | 0.19 | 0.5 | 0 | balance | 7 |
| 2 | CVD | 750 | 0.5 | 80-120 | 0.53 | 0.11 | 0.5 | 0 | balance | 11 |
| 3 | CVD | 750 | 0.5 | 80-120 | 0.53 | 0.16 | 0.7 | 0 | balance | 15 |
| 4 | CVD | 750 | 1.0 | 80-120 | 0.58 | 0.14 | 1.3 | 0.2 | balance | 13 |
| 5 | CVD | 720 | 1.0 | 80-120 | 0.62 | 0.14 | 1.0 | 0.3 | balance | 12 |
| 6 | CVD | 720 | 3.0 | 80-120 | 0.62 | 0.05 | 0.5 | 0.3 | balance | 11 |
| 7 | CVD | 720 | 3.0 | 80-120 | 0.62 | 0.08 | 1.0 | 0 | balance | 12 |
| 8 | CVD | 720 | 3.0 | 80-120 | 0.53 | 0.13 | 1.0 | 0.3 | balance | 13 |
| 9 | CVD | 740 | 2.0 | 80-120 | 0.65 | 0.31 | 1.0 | 0 | balance | 13 |
| 10 | CVD | 740 | 2.0 | 80-120 | 0.74 | 0.14 | 1.0 | 0.7 | balance | 13 |
| 11 | CVD | 740 | 2.0 | 80-120 | 0.65 | 0.37 | 1.0 | 0 | balance | 13 |
| 12 | CVD | 740 | 2.0 | 80-120 | 0.58 | 0.11 | 1.0 | 0.8 | balance | 13 |
| 13 | CVD | 720 | 1.0 | 80-120 | 0.71 | 0.15 | 1.0 | 0.3 | balance | 11 |
| 14 | CVD | 720 | 0.5 | 80-120 | 0.62 | 0.14 | 1.0 | 0 | balance | 18 |
| 15 | CVD | 720 | 1.0 | 80-120 | 0.49 | 0.11 | 1.4 | 0.3 | balance | 12 |
| 16 | CVD | 720 | 3.0 | 80-120 | 0.57 | 0.02 | 0.8 | 0 | balance | 11 |
| 17 | CVD | 730 | 3.0 | 80-120 | 0.67 | 0.11 | 1.5 | 0 | balance | 12 |
| 18 | CVD | 720 | 3.0 | 80-120 | 0.68 | 0.12 | 1.0 | 0 | balance | 10 |
| 19 | CVD | 750 | 0.5 | 80-120 | 0.53 | 0.11 | 0.5 | 0 | balance | 10 |
| 20 | CVD | 750 | 0.5 | 80-120 | 0.81 | 0.19 | 0.5 | 0 | balance | 7 |

[Table 4]

TABLE 4

| Sample No. | Ratios of starting material gases (% by volume) | | | Temperature (° C.) | Pressure (kPa) | Total gas flow rate (L/min) |
| --- | --- | --- | --- | --- | --- | --- |
| | TiCl₄ | NH₃ | H₂ | | | |
| 1 | — | — | — | — | — | — |
| 2 | — | — | — | — | — | — |
| 3 | — | — | — | — | — | — |
| 4 | — | — | — | — | — | — |
| 5 | — | — | — | — | — | — |
| 6 | — | — | — | — | — | — |
| 7 | — | — | — | — | — | — |
| 8 | — | — | — | — | — | — |
| 9 | — | — | — | — | — | — |
| 10 | — | — | — | — | — | — |
| 11 | — | — | — | — | — | — |
| 12 | — | — | — | — | — | — |
| 13 | — | — | — | — | — | — |
| 14 | — | — | — | — | — | — |
| 15 | — | — | — | — | — | — |
| 16 | — | — | — | — | — | — |
| 17 | — | — | — | — | — | — |
| 18 | — | — | — | — | — | — |
| 19 | 1.50 | 1.0 | balance | 750 | 1 | 80 |
| 20 | — | — | — | — | — | — |

Further, after forming coated film as described above, the third step was carried out under the blasting treatment conditions shown in Table 5.

[Table 5]

TABLE 5

| Sample No. | Media | | Average particle size (μm) | Blast angle (°) | Blast distance (mm) | Blast time (sec) | Blast pressure (MPa) | Rotational speed (rpm) |
| --- | --- | --- | --- | --- | --- | --- | --- | --- |
| | Type | Weight (g) | | | | | | |
| 1 | alumina particles | 500 | 50 | 45 | 50 | 6 | 0.16 | 60 |
| 2 | alumina particles | 500 | 50 | 45 | 50 | 6 | 0.16 | 60 |
| 3 | alumina particles | 500 | 50 | 45 | 50 | 6 | 0.17 | 60 |
| 4 | alumina particles | 500 | 50 | 45 | 50 | 6 | 0.16 | 60 |
| 5 | alumina particles | 500 | 50 | 45 | 50 | 6 | 0.15 | 60 |
| 6 | alumina particles | 500 | 50 | 45 | 50 | 6 | 0.16 | 60 |
| 7 | alumina particles | 500 | 50 | 45 | 50 | 6 | 0.22 | 60 |

TABLE 5-continued

| Sample No. | Media Type | Weight (g) | Average particle size (μm) | Blast angle (°) | Blast distance (mm) | Blast time (sec) | Blast pressure (MPa) | Rotational speed (rpm) |
|---|---|---|---|---|---|---|---|---|
| 8 | alumina particles | 500 | 50 | 45 | 50 | 4 | 0.10 | 60 |
| 9 | alumina particles | 500 | 50 | 45 | 50 | 5 | 0.18 | 60 |
| 10 | alumina particles | 500 | 50 | 45 | 50 | 5 | 0.16 | 60 |
| 11 | alumina particles | 500 | 50 | 45 | 50 | 5 | 0.17 | 60 |
| 12 | alumina particles | 500 | 50 | 45 | 50 | 5 | 0.16 | 60 |
| 13 | alumina particles | 500 | 50 | 45 | 50 | 6 | 0.18 | 60 |
| 14 | alumina particles | 500 | 50 | 45 | 50 | 6 | 0.17 | 60 |
| 15 | alumina particles | 500 | 50 | 45 | 50 | 6 | 0.16 | 60 |
| 16 | alumina particles | 500 | 50 | 45 | 50 | 6 | 0.17 | 60 |
| 17 | alumina particles | 500 | 50 | 45 | 50 | 6 | 0.25 | 60 |
| 18 | alumina particles | 500 | 50 | 45 | 50 | 3 | 0.10 | 60 |
| 19 | alumina particles | 500 | 50 | 45 | 50 | 6 | 0.15 | 60 |
| 20 | alumina particles | 500 | 50 | 45 | 50 | 6 | 0.16 | 60 |

By carrying out the above steps, the cutting tools of Sample Nos. 1 to 20 having the configurations shown in Tables 6 and 7 were produced.

<<Evaluation of cutting tool properties>>

For the cutting tools of Samples Nos. 1 to 20 produced as described above, various properties of the cutting tools were evaluated in the manner described below. Note that the cutting tools of Sample Nos. 1 to 9 and 17 to 20 correspond to examples, and the cutting tools of Sample Nos. 10 to 16 correspond to comparative examples.

<Measurement of thickness of coated film etc.>

For the cutting tools of Sample Nos. 1 to 20, the thickness of each of the coated film, the first layer constituting the coated film, and the base layer were determined by the method described for the first aspect. The obtained results are shown in the column "thickness of the first layer (μm)" of Tables 6 and 7, the column "thickness of the base layer (μm)" of Table 6, and the column "thickness of the surface layer (μm)" of Table 6, respectively.

[Table 6]

TABLE 6

| Sample No. | Presence/ absence of base layer | Thickness of base layer (μm) | Thickness of first layer (μm) | $Al_xTi_{1-x}C_yN_{1-y}$ x (average value) | y (average value) | Presence/ absence of surface layer | Thickness of surface layer (μm) |
|---|---|---|---|---|---|---|---|
| 1 | present | 0.3 | 5.1 | 0.81 | 0 | absent | — |
| 2 | present | 0.3 | 5.2 | 0.83 | 0 | absent | — |
| 3 | present | 0.3 | 5.3 | 0.77 | 0 | absent | — |
| 4 | present | 0.3 | 5.2 | 0.80 | 0.02 | absent | — |
| 5 | present | 0.3 | 5.2 | 0.82 | 0.03 | absent | — |
| 6 | present | 0.3 | 5.0 | 0.93 | 0.03 | absent | — |
| 7 | present | 0.3 | 5.0 | 0.89 | 0 | absent | — |
| 8 | present | 0.3 | 5.3 | 0.80 | 0.02 | absent | — |
| 9 | present | 0.3 | 5.2 | 0.68 | 0 | absent | — |
| 10 | present | 0.3 | 5.1 | 0.84 | 0.10 | absent | — |
| 11 | present | 0.3 | 5.3 | 0.64 | 0 | absent | — |
| 12 | present | 0.3 | 5.4 | 0.84 | 0.12 | absent | — |
| 13 | present | 0.3 | 5.0 | 0.83 | 0.02 | absent | — |
| 14 | present | 0.3 | 5.3 | 0.82 | 0 | absent | — |
| 15 | present | 0.3 | 5.2 | 0.82 | 0.02 | absent | — |
| 16 | parsent | 0.3 | 5.3 | 0.96 | 0 | absent | — |
| 17 | present | 0.3 | 5.0 | 0.86 | 0 | absent | — |
| 18 | present | 0.3 | 5.2 | 0.85 | 0 | absent | — |
| 19 | present | 0.3 | 5.1 | 0.81 | 0 | present | 0.3 |
| 20 | absent | — | 5.1 | 0.81 | 0 | absent | — |

<Measurement of x (average value) and y (average value)>

For the cutting tools of Sample Nos. 1 to 20, x (average value) and y (average value) were determined by the method described for the first aspect. The obtained results are shown in the column "x (average value)" and "y (average value)" of "$Al_xTi_{1-x}C_yN_{1-y}$" in Tables 6 and 7, respectively.

<Measurement of the average aspect ratio of the crystal grains in the first and second regions>

For the cutting tools of Sample Nos. 1 to 20, the average aspect ratio of the crystal grains in the first region and the average aspect ratio of the crystal grains in the second region were determined by the method described for the first aspect. The obtained results are shown in the column "average aspect ratio of the crystal grains in the first region" in Table 7 and the column "average aspect ratio of the crystal grains in the second region" of Table 7.

[Table 7]

TABLE 7

| Sample No. | Thickness of first layer (μm) | $Al_xTi_{1-x}C_yN_{1-y}$ x (average value) | y (average value) | Average aspect ratio of crystal grains in first region | Average aspect ratio of crystal grains in second region | Area ratio (%) | Compressive residual stress (GPa) | Hardness (GPa) | Cutting test (passes) |
|---|---|---|---|---|---|---|---|---|---|
| 1  | 5.1 | 0.81 | 0    | 1.3 | 6.5  | 98  | 3.2 | 34 | 35 |
| 2  | 5.2 | 0.83 | 0    | 2.2 | 6.4  | 99  | 3.2 | 35 | 34 |
| 3  | 5.3 | 0.77 | 0    | 2.9 | 6.9  | 99  | 3.3 | 33 | 33 |
| 4  | 5.2 | 0.80 | 0.02 | 2.6 | 9.3  | 99  | 3.2 | 35 | 30 |
| 5  | 5.2 | 0.82 | 0.03 | 2.3 | 3.3  | 98  | 3.0 | 33 | 30 |
| 6  | 5.0 | 0.93 | 0.03 | 2.2 | 9.7  | 91  | 3.1 | 30 | 31 |
| 7  | 5.0 | 0.89 | 0    | 2.4 | 7.1  | 91  | 4.4 | 36 | 33 |
| 8  | 5.3 | 0.80 | 0.02 | 2.5 | 7.2  | 100 | 1.2 | 35 | 30 |
| 9  | 5.2 | 0.68 | 0    | 2.5 | 5.9  | 100 | 3.5 | 30 | 30 |
| 10 | 5.1 | 0.84 | 0.10 | 2.5 | 6.9  | 96  | 3.2 | 38 | 21 |
| 11 | 5.3 | 0.64 | 0    | 2.5 | 6.7  | 97  | 3.3 | 28 | 18 |
| 12 | 5.4 | 0.84 | 0.12 | 2.5 | 6.9  | 96  | 3.1 | 42 | 16 |
| 13 | 5.0 | 0.83 | 0.02 | 2.2 | 2.5  | 98  | 3.5 | 33 | 22 |
| 14 | 5.3 | 0.82 | 0    | 3.5 | 7.5  | 98  | 3.4 | 34 | 22 |
| 15 | 5.2 | 0.82 | 0.02 | 2.3 | 10.5 | 98  | 3.1 | 32 | 23 |
| 16 | 5.3 | 0.96 | 0    | 2.2 | 6.9  | 89  | 3.3 | 27 | 20 |
| 17 | 5.0 | 0.86 | 0    | 2.3 | 7.3  | 94  | 4.9 | 27 | 26 |
| 18 | 5.2 | 0.85 | 0    | 2.0 | 6.0  | 97  | 0.8 | 34 | 25 |
| 19 | 5.1 | 0.81 | 0    | 1.3 | 6.5  | 98  | 3.1 | 35 | 35 |
| 20 | 5.1 | 0.81 | 0    | 1.3 | 6.5  | 98  | 3.2 | 34 | 28 |

<Measurement of area ratio>

For the cutting tools of Sample Nos. 1 to 20, the ratio of the area occupied by the crystal grains having a cubic crystal structure in the first layer was determined by the method described for the first aspect. The obtained results are respectively shown in the column "area ratio (%)" in Table 7.

<Measurement of compressive residual stress>

For the cutting tools of Sample Nos. 1 to 20, the compressive residual stress of the first layer was determined by the method described for the first aspect. The obtained results are shown in the column "compressive residual stress (Gpa)" in Table 7.

<Hardness measurement>

For the cutting tools of Sample Nos. 1 to 20, the hardness of the first layer was determined by the method described for the first aspect. The obtained results are shown in the column "hardness (GPa)" in Table 7.

<<Cutting test>>

Using the obtained cutting tools, cutting was performed under the following cutting conditions. A cutting distance of 300 mm was set as one pass, and damage was checked after each pass. The number of passes until a defect occurred in the tool due to thermal crack and flank wear was evaluated. Here, "defect" means a maximum flank wear of more than 0.4 mm. The results are shown in the column "cutting test (number of passes)" in Table 7. Here, when the number of passes until a defect occurred in the tool was not less than 25 passes, this means that thermal cracking resistance and wear resistance were good. That is, when the number of passes is not less than 25 passes, this means that the tool has a long life.

(Cutting conditions)
Material: FC250 block material (100 mm×80 mm)
Cutting speed: 250 m/min
Feed rate: 0.2 mm/t
Cutting amount: 2.0 mm
Wet/Dry: Wet The cutting conditions correspond to wet processing of gray cast iron.

<Results>

From the results of Table 7, it can be seen that in wet processing of gray cast iron, the cutting tools of Sample Nos. 1 to 9 and 17 to 20 according to examples had better thermal cracking resistance and better wear resistance than the cutting tools of Samples 10 to 16 according to comparative examples. Therefore, it was found that the cutting tools of Sample Nos. 1 to 9 and 17 to 20 according to examples have a long tool life even in wet processing of gray cast iron.

The embodiments and examples of the present disclosure have been described above. It is expected from the beginning that the configurations of those embodiments and examples are to be appropriately combined or modified in various ways.

The embodiments and examples of disclosed herein are exemplary illustrations in all respects and should not be considered as being limiting. The scope of the present invention is defined by the scope of claims, and not by the above embodiments and examples, and is intended to include equivalent meanings as those of the claims and even all modifications within the scope thereof.

REFERENCE SIGNS LIST 1 cutting tool; 1a rake face, 1b flank face; 1c cutting edge portion; 10 substrate; 11 first layer; 12 base layer; 13 surface layer; 14 coated film; 20a crystal grain included in a first region; 20b crystal grain included in a second region; 21a crystal grain straddling S1 or S2; 21b crystal grain straddling VS1; 21c crystal grain straddling L1; 50 CVD apparatus; 52 substrate-setting jig; 53 reaction vessel; 54 temperature control device; 55 gas introduction tube; 56 gas exhaust tube; 57 gas exhaust port; S1 first layer surface; S2 interface on the surface side of the first layer; S3 interface on the substrate side of the first layer; L1 first virtual line; R1 first region; R2 second region

The invention claimed is:

1. A cutting tool comprising:
a substrate; and
a coated film arranged on the substrate, wherein
the coated film includes a first layer,
the first layer includes a plurality of crystal grains, and
the crystal grains are composed of $al_xTi_{1-x}C_yN_{1-y}$,
where x is more than 0.65 and less than 0.95, and
y is not less than 0 and less than 0.1,
wherein
in a first region, the crystal grains have an average aspect ratio of not more than 3.0, where the first region is a region that is sandwiched between a surface S1 of the first layer or an interface S2 on a surface side of the first layer and a first virtual plane VS1, and
in a second region, the crystal grains have an average aspect ratio of more than 3.0 and not more than 10.0, where the second region is a region that is sandwiched between the first virtual plane VS1 and an interface S3 on a substrate side of the first layer,
where the first virtual plane VS1 passes through a point that is 1 μm away from the surface S1 or the interface S2 on the substrate side, and is parallel to the surface S1 or the interface S2,
wherein
the crystal grains include crystal grains having a cubic crystal structure,
the first layer has a ratio of an area occupied by the crystal grains having a cubic crystal structure of not less than 90%,
the average aspect ratios and the area ratio are measured on a cross section along a normal to an interface between the substrate and the coated film, and
the first layer has a thickness of not less than 2 μm and not more than 20 μm.

2. The cutting tool according to claim 1, wherein the first layer has a compressive residual stress of not less than 1.0 GPa and less than 4.5 GPa.

3. The cutting tool according to claim 1, wherein the first layer has a hardness of not less than 30 GPa and not more than 40 GPa.

* * * * *